United States Patent [19]

Pfizenmaier et al.

[11] Patent Number: 4,817,189
[45] Date of Patent: Mar. 28, 1989

[54] DIRECTIONAL HIGH FREQUENCY BROADBAND TRANSFORMER MADE BY PRINTED CIRCUIT TECHNIQUE

[75] Inventors: Heinz Pfizenmaier, Leonberg; Ewald Schmidt, Ludwigsburg, both of Fed. Rep. of Germany

[73] Assignee: Robert Bosch GmbH, Stuttgart, Fed. Rep. of Germany

[21] Appl. No.: 139,847

[22] Filed: Dec. 29, 1987

Related U.S. Application Data

[63] Continuation-in-part of Ser. No. 852,809, Feb. 21, 1986, abandoned.

[30] Foreign Application Priority Data

Jul. 7, 1984 [DE] Fed. Rep. of Germany ....... 3425153

[51] Int. Cl.$^4$ .......................... H04H 1/02; H01P 5/16
[52] U.S. Cl. ...................................... 455/6; 333/116; 333/136; 455/289
[58] Field of Search ...................... 333/24 R, 112, 116, 333/136; 323/355, 356; 336/200; 455/6, 289

[56] References Cited

U.S. PATENT DOCUMENTS 3,465,274  9/1969  Proctor ........................... 336/200 X
4,012,703  3/1977  Chamberlayne ................... 333/24 R
4,201,965  5/1980  Onyshkevych ................. 336/200 X

FOREIGN PATENT DOCUMENTS 1073046  1/1960  Fed. Rep. of Germany .
2230587  1/1974  Fed. Rep. of Germany .
2830732  1/1980  Fed. Rep. of Germany .
2917388  11/1980  Fed. Rep. of Germany .

*Primary Examiner*—Paul Gensler
*Attorney, Agent, or Firm*—Michael J. Striker

[57] ABSTRACT

A directional H.F. broadband transformer made by a printed circuit technique includes an insulating support carrying a two-hole ferrite core. A planar coil arrangement includes two web spirals wound around outer legs of the core and each being coupled to an elongated web arranged in the same plane and passing through a corresponding hole of the core. The two elongated webs are formed with an input terminal, an output terminal and a tap terminal of equal impedance. An isolated conductive layer mounted above the webs on the insulating support is capacitively coupled with the coil arrangement and with a ground layer to reduce values of series connected distributed capacitors resulting between respective webs and the ground layer.

6 Claims, 4 Drawing Sheets

DIRECTIONAL HIGH FREQUENCY BROADBAND TRANSFORMER MADE BY PRINTED CIRCUIT TECHNIQUE

CROSS-REFERENCE TO RELATED APPLICATION

This is a continuation-in-part of application Ser. No. 852,809, filed Feb. 21st, 1986, now abandoned.

BACKGROUND OF THE INVENTION

The invention relates to a directional high-frequency broadband transformer or antenna coupler in the form of a printed circuit including an inductance component provided with a magnetically closed ferrite core and conductive webs printed on an insulating support and a capacitance component in the form of a conductive layer.

A high frequency transformer arrangement without ferromagnetic material for the meter and decimeter wave lengths is known from the German publication DE-AS No. 1073046. This known device is provided with inductances having a defined configuration and with capacitors which are shaped as a double sided printed circuit. The spiral like inductances consist of two coils which are connected with each other on each side of a substrate support. The capacitances are formed as oppositely disposed conductive layers which are separated by the substrate and are galvanically contacted, whereby the contacts interconnect the layers and the coil connections.

A further known transformer in accordance with DE-AS No. 2230587 in the printed technology has a platelet like winding support made from electrically insulating material with at least a planar spiral like winding mounted thereon, and a ferrite core whose magnetic circuit is coupled with the electric circuit of the winding(s). The ferrite core is separated into two parts, i.e., it has an air gap in the magnetic circuit. No sufficient high inductances can be obtained therewith at high frequencies in the megahertz range, since ferrite materials have a low permeability at these frequencies.

Furthermore, known are coil devices with a multi-hole core, wherein two pairs of coils are mounted on an insulating support and are in the form of printed conductive webs. The insulating support is provided with openings arranged within and/or outside the coils. These openings are filled with non-sintered ferrite material and ferrite material is also applied on the upper and lower side of the insulating support.

Subsequently the entire device is sintered, so that a coil arrangement with closed ferrite core is obtained which has a very low magnetic stray flux (DE-OS No. 2917388). However, the technology which is used for making the ferrite cores is rather expensive and can only be controlled with difficulties, i.e., the transmission characteristic of the coil arrangement have large deviations in mass production.

Finally, it is known from DE-OS No. 2830732 to reduce parasitic capacities in coils with printed conductive webs and to increase the limit frequency of the coil by making the insulating distance between the conductive webs non-constant, at least in partial ranges. However, no closed magnetic circuit can be obtained, as required for wide band transformers.

ADVANTAGES OF THE INVENTION

In contrast thereto, the transformer in accordance with the invention wherein a dielectric layer overlaps the conductive layer and at least a part of the conductive webs of the printed coil arrangement, is advantageous in that the inductive transmission in the lower frequency range (several megahertz) continuously changes into a microstrip-coupler-transmission when the transmitted signal approaches the upper frequency range (several hundreds of megahertz). The conductive layer, which is not in ohmic contact with any circuit component has the effect of series connected capacitors which capacitively couple parts of the conductive webs and the connections and thereby advantageously change all parameters of the transformer in the medium and upper high frequency range. With a suitable geometric design of the conductive layer and the thickness of the dielectric support the circuit can be best adjusted to operational requirements. Thereby, the transformer can be made in a planar design which exhibits considerably improved operational values in the medium and upper high frequency range than customary wire wound transformers.

To simplify manufacture, it is particularly advantageous when an additional insulating support is used as the dielectric layer, whereby the additional insulating support is mounted on the insulating support for the conductive webs by soldering for instance, and then is provided with the conductive layer. If the transformer has a balancing resistor it is preferably mounted on the insulating support which supports the conductive webs and is connected with the coil arrangement by means of a strip-like conductor. A higher damping of the transmission from a tap terminal to the output of the transformer can be obtained in the upper frequency range by using a strip-like conductor with defined parameters. Furthermore, it is advantageous when the balancing resistor has a resistance value which deviates from the characteristic impedance of the system and the coil arrangement is provided with multiple-winding conductive web spirals, whose outer ends are grounded. Due to these two measures the damping values of the transmission from the tap terminal to the output in the lower high frequency range can be considerably improved, whereby in particular the nonsymmetric winding number ratio of the coils achieved due to the grounded connection of the outer coil ends contributes to this improvement.

DRAWING

One exemplified embodiment of the invention is illustrated in the drawing and is explained in more detail in the subsequent description.

Figure 4:
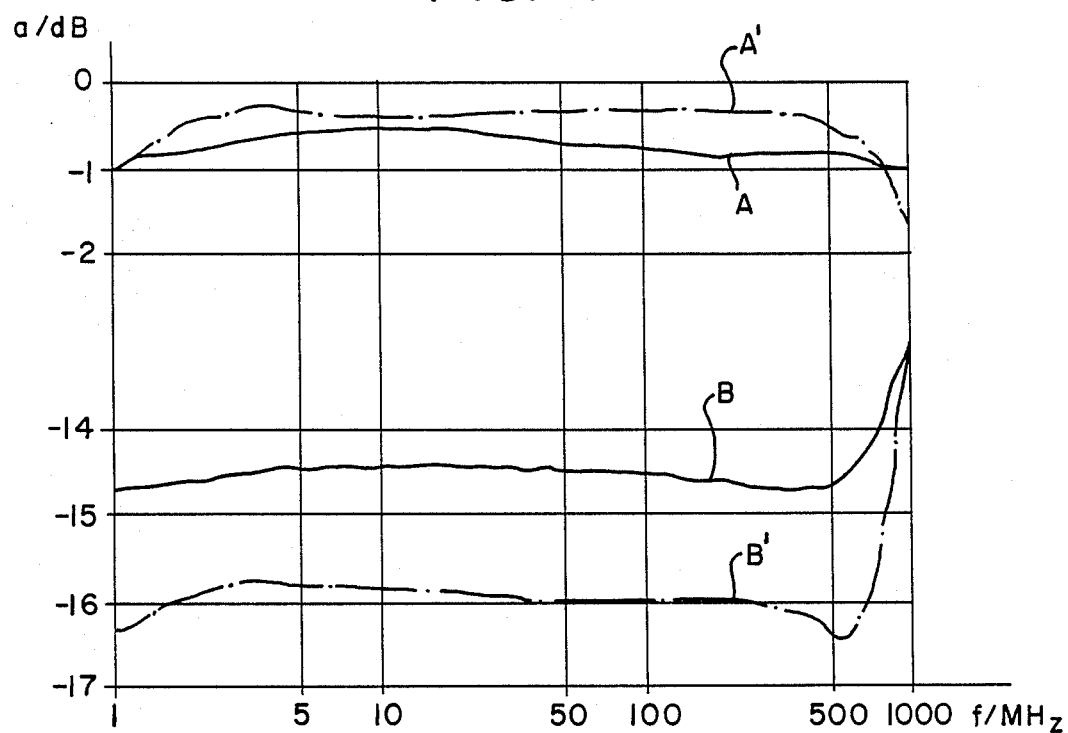
Figure 5:
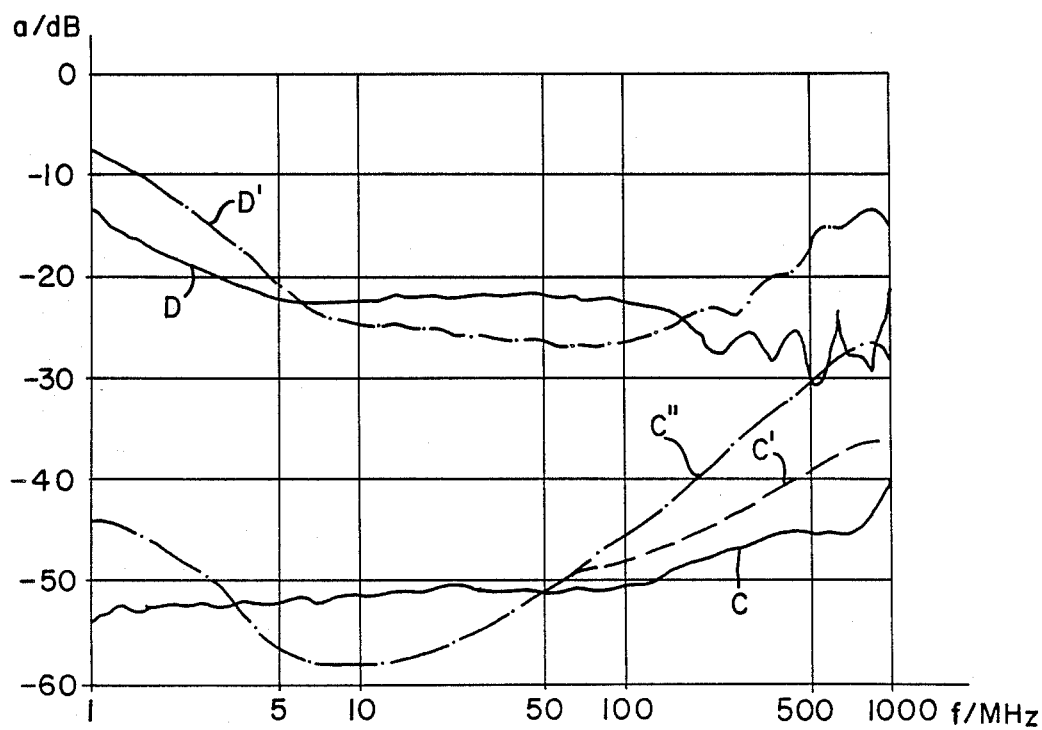
Figure 6:
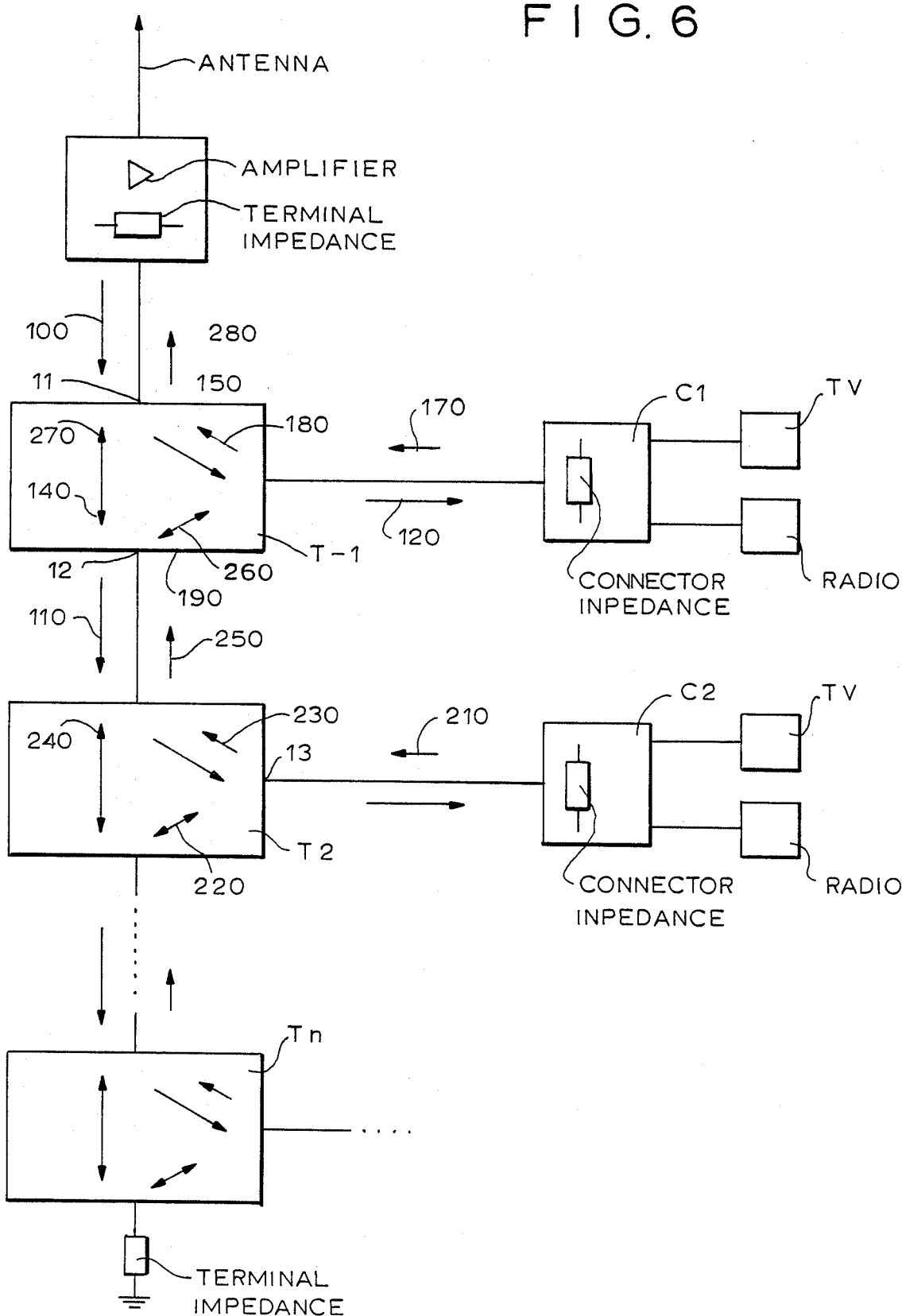

FIGS. 4 and 5 diagrams illustrate the pattern of different electric transmission values in comparison with values of differently designed transformers; and FIG. 6 shows a block diagram of a master antenna system provided with a plurality of directional H.F. broadband transformers of this invention.

DESCRIPTION OF THE EXEMPLIFIED EMBODIMENT

Figure 1:
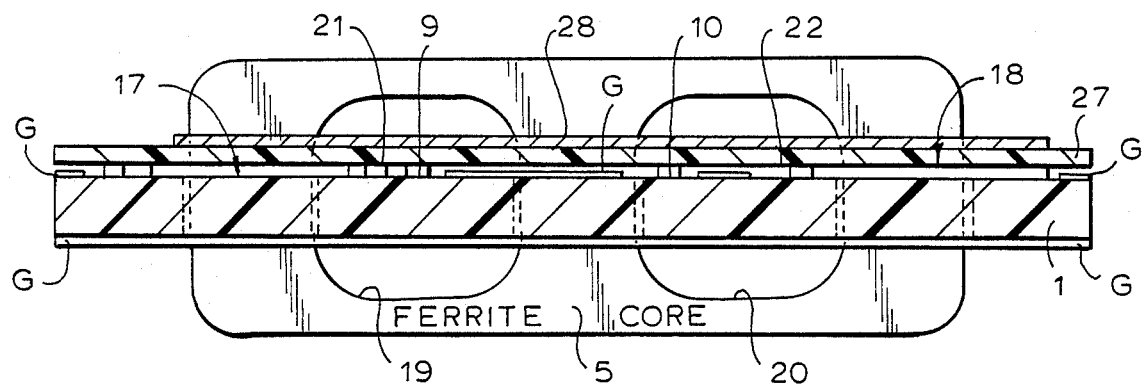
FIG. 1 illustrates a sectional side view, taken along line II—II of FIG. 2 of the directional H.F. broadband transformer having two supports.
Figure 2:
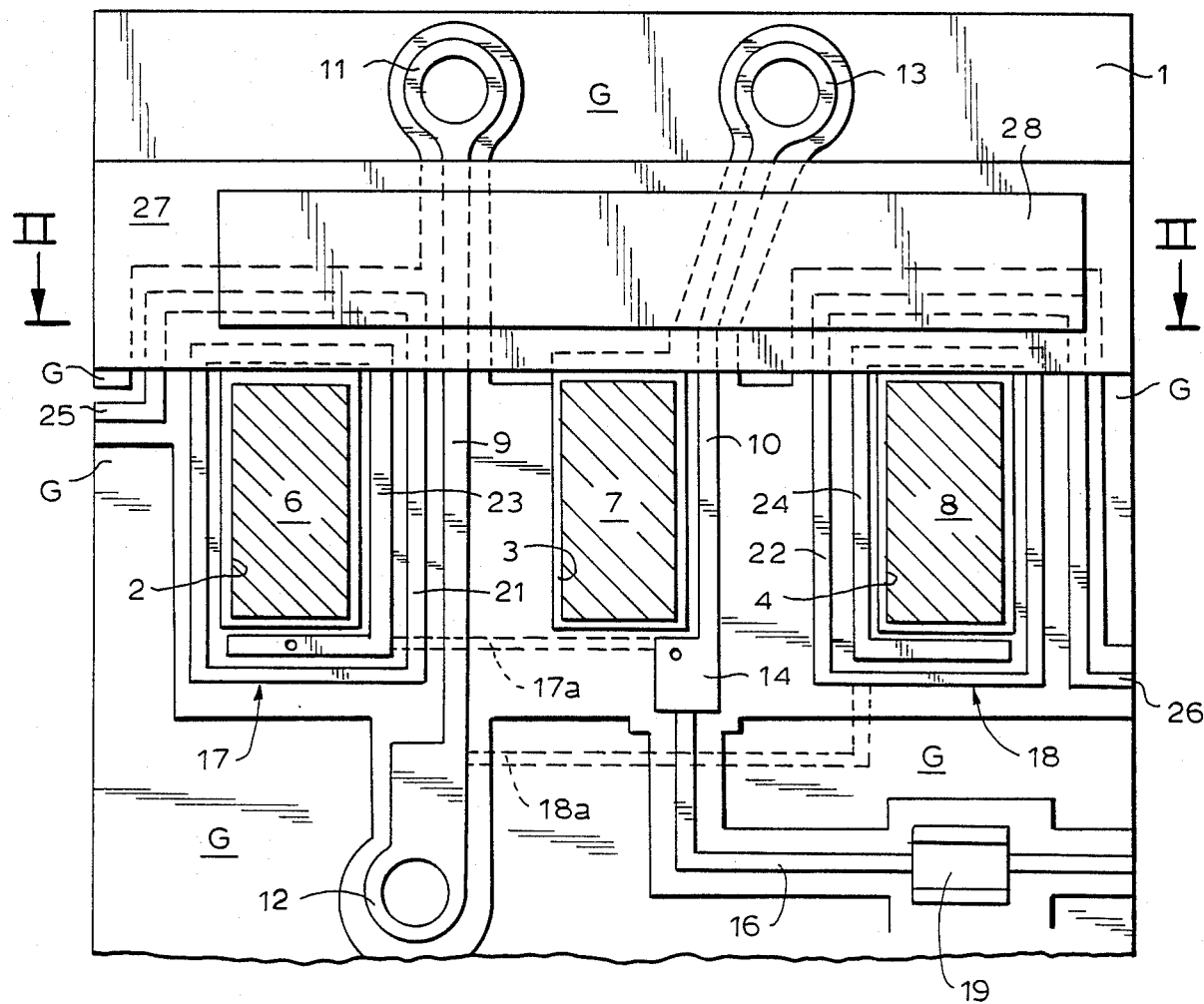
FIG. 2 shows a plan view, partly in section, of the transformer of FIG. 1.

The direction controlled high frequency broadband transformer or transmission line coupler illustrated in FIGS. 1 and 2 has an insulating support 1 which consists of a generally known flexible material which is highly insulating and which automatically springs back into its planar condition after a deformation. The insulating support 1 has three rectangular openings 2, 3, 4 (FIG. 2) for receiving a closed two-hole ferrite core 5. The size of the openings is adapted to the cross section of the core legs 6, 7, 8. For introducing the ferrite core 5 into openings 2 to 4 the insulating support 1 may be provided with yielding tongues (non-illustrated) which are liftable from the plane of the support. These tongues are described in German patent application P No. 3322004.2.

In accordance with a known printing method a planar coil arrangement in the form of four conductive webs 9, 10, 17 and 18 is mounted on the upper side of the insulating support 1. The coil arrangement includes two elongated conductive webs 9, 10, whose both ends are provided with terminals 11, 12 and 13, 14. The terminal 11 forms the input, the terminal 12 the output and the terminal 13 the tap of the transformer system. Terminal 14 of conductive web 10 is grounded through a balancing resistor 15. A strip-like connector 16 is used for connecting the terminal 14 to the balancing resistor 15.

Opposite to respective conductive webs 9, 10 there is arranged one of two conductive web spirals 17 or 18. Each spiral has a rectangular configuration and surrounds a leg 6 or 8 of the ferrite core 5. The conductive webs 9, 10 which extend through the core holes 19 or 20 of the ferrite core have different widths, as can be seen from FIG. 2, and a different distance from the facing segments 21 or 22 of the conductive web spirals 17 or 18. Preferably, the width of the conductive web 10 is smaller than the width of the conductive web 9 and the distance of the conductive web 9 from the facing segment 21 of the conductive web spiral 17 is smaller than the distance of the conductive web 10 from segment 22 of the conductive web spiral 18. Moreover, the width of the segments 22, 24 of the conductive web spiral 18 extending through the hole 20 of the ferrite core 5 is smaller than the width of the conductive web segments 21, 23 of the spiral 17 passing through the core hole 19. The reverse relation is true with respect to the distances of segments 22 to 24 and 21 to 23. The aforementioned parameters are so selected that the coil parts 9, 17 and 10, 18 form respectively a modified strip-line coupler and the couplers are geometrically uneven (nonsymmetrical). In contrast to conventional strip line couplers where strip conductors are located above a ground plane, the conductive webs 9 and 10 in the modified strip line coupler are coupled to the spirals 17 and 18 on the same side of substrate 1 without ground plane, if both sides of the substrate are provided with ground planes, then a circuit or a "window" is formed in the corresponding ground plane in the region of openings of the ferrite core 5, and the webs 9 and 10 are located in the cutout or "window". Ground layer G is provided on both sides of the substrate and surrounds in a spaced relationship the conductive webs 9–18, but not inside the coil holes.

The two conductive web spirals 17, 18 have oppositely directed windings which run from the inside to the outside in such a manner that the outer end 25 or 26 of the spirals is grounded. Thereby, different winding number ratios of coil parts 9 and 17, or 10 and 18 as well as of 17 and 18 can be realized with the same number of conductors which pass through the core holes 19, 20. Preferably, the winding number ratio of coil parts 10 and 18 is selected larger than the ratio of coil parts 9 and 17, whereby the winding numbers of coil parts 9 and 10 are equal and the number of the conductive web spiral segments 21, 23 and 22, 24 passing through each of the two core holes 19, 20 is identical. The difference between the two relationships depends on the desired nominal transmission damping in decibels (e.g. 15dB), from the input 11 to the tap 13. The inner end or beginning of web spiral 17 which is adjacent to core leg 6 is connected with the conductive web 10 by means of a strip-line 17 a, while the beginning of the conductive web spiral 18 is connected to the conductive web 9 by means of a strip-line 18 a. The strip-lines 17 a and 18 a are mounted on the rear side of the insulating support 1.

The real or ohmic balancing resistor 15 can be directly integrated in the circuit, that is, either in a printed-technique according to the thin layer or thick layer technology, or in the form of a discrete structural element which can be either soldered on or bonded on the substrate. It is essential that the nominal value of the resistor 15 be not identical with the characteristic impedance of the transformer system. In a nominal transmission damping of 15 db the value of the resistor 15 may be 82 Ohm, at a characteristic impedance $Z_0 = 75$ Ohm. Substantially higher damping values of the transmission from the tap terminal 13 to the output 12 can be obtained, due to this measure in combination with the uneven winding number ratios in the coil arrangement.

An additional, smaller insulating support 27 is mounted on the insulating support 1 and extends between the ferrite core 5 and the terminals 11, 13. For this support, both rigid materials and also highly flexible thin insulating materials are suitable. The flexible materials are used in particular if the insulating support 1 has a sufficient stability. The additional insulating support 27 is provided on its surface facing away from coil arrangement 9, 17; 10, 18 with a conductive layer 28 which in the exemplified embodiment has a rectangular shape and is mounted on the insulating support 27 in such a manner that it covers parts of the conductive webs in the area of the input terminal, tap terminal and grounded terminal. The conductive layer 28 is preferably applied directly on the insulating support 27 by means of the printing method. However, it may also consist of a bonded conductive material, for example, a copper foil or a bonded insulating foil with a deposited conductive layer.

Figure 3:
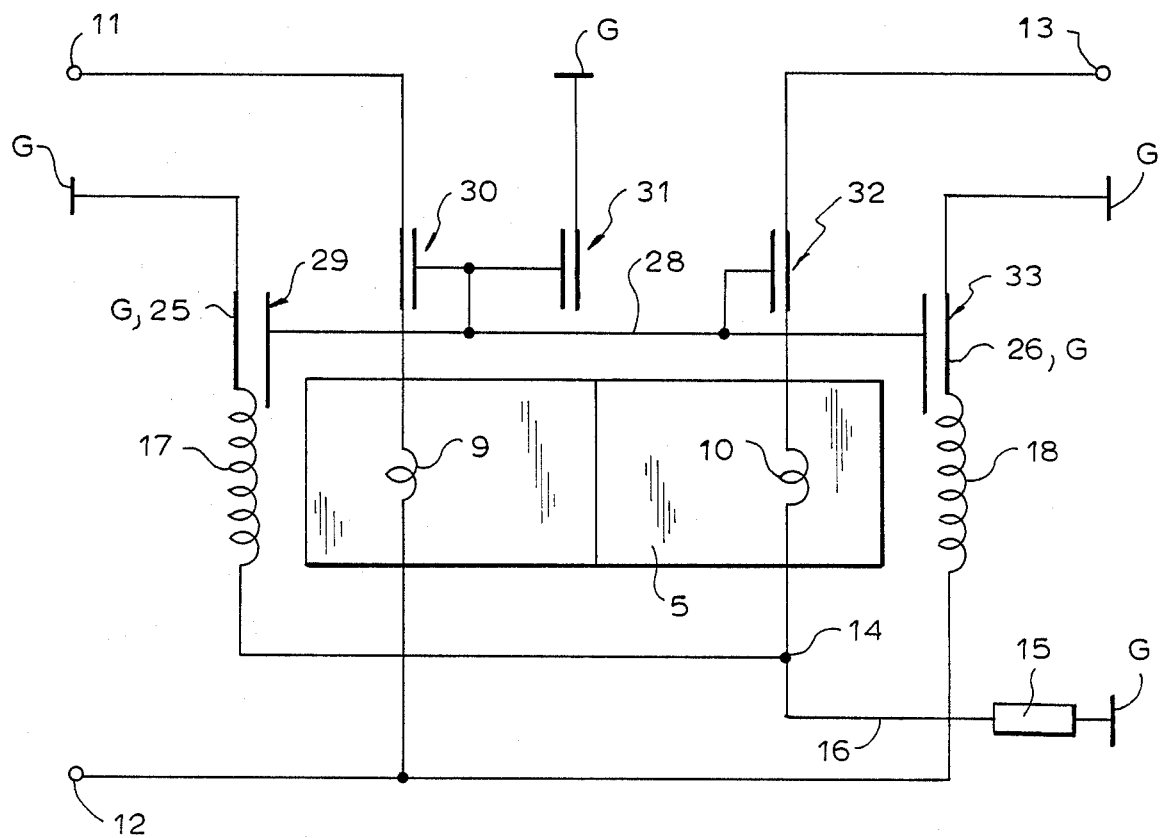
FIG. 3 is a low frequency equivalent circuit diagram of the transformer of FIG. 1.

The conductive layer 28 is capacitively coupled with the coil arrangement by means of the insulating support 27 which acts as a dielectric. As shown in the equivalent LF circuit diagram in FIG. 3, the conductive webs of the coil and their terminals, together with the conductive layer 28 represent series connected distributed capacitors 29 to 33, between input 11, ground layer G, tap 13 and parts of the conductive webs 9, 17; 10, 18. No feed-through connections on the insulating support 27 are present.

All circuit parameters in the medium and upper high frequency range are changed in a desired manner by these distributed series connected capacitors, generated by a contactless conductive layer. Optimum values may be obtained for all essential parameters of the circuit by means of a suitable geometric design of the conductive layer 28 and by adjusting the thicknesses of the dielectric layer 27.

The diagrams in accordance with FIGS. 4 and 5 originate from 15 decibel transformers which are non-symmetrical with respect to width, distance and winding number ratio of their conductive webs. The transmission characteristic between the input 11 and output 12 which is called a passage, is almost linear over the total frequency range, only with a small drop in the area of the upper limit frequency (characteristic curve A in FIG. 4). The characteristic curve A', with a dB drop illustrates the passage of comparable, wire wound transformers. FIG. 4 also illustrates the connecting characteristic curves (transmission input 11-tap 13). The characteristic curve B stands for a transformer designed in accordance with the invention, whereas the characteristic curve B' stands for a wire wound transformer. The characteristic curve C in the diagram of FIG. 5 stands for the decoupling between the output 12 and tap 13 and vice versa and its course is almost optimum with a transformer which is provided with the layer 28. This is demonstrated by comparing it with the decoupling characteristic curve C' of a transformer without a conductive layer 28 and with the characteristic curve C" of a wire wound transformer. Moreover, the course of reflection damping at input 11 of the transformer in accordance with the invention and of a conventional wire wound transformer is illustrated by curves D and D' in FIG. 5. A prior art wire wound transformer has a better match for the frequency range between 6-200 MHz (curve D') while above 200MHz the printed transformer or coupler of this invention has a substantially better matching or reflection damping quality (curve D).

FIG. 6 shows schematically a block circuit of a master antenna system for an apartment building using a plurality of directional H.F. broadband transformers T1 to $T_n$ of this invention to distribute a signal from the antenna to remote antenna connectors C1 to $C_n$ in individual apartments. The master antenna system of this kind is called a matched transformer network, or a hybrid- or bridge transformer network. A signal received by the antenna is amplified in an antenna amplifier to a desired level. The terminal impedance of the amplifier corresponds to the characteristic impedance of the master antenna system. The amplified signal 100 is applied to input terminal 11 of the first transformer Tn where it is split-up or transformed into two signal components 140 and 150. The signal component 140 is delivered to the output terminal 12 while the signal component 150 is branched to the tap terminal 13 and is transmitted as a branch signal 120 to the remote antenna connector C1. The transmission characteristic of the signal component 140 in the transformer is represented by the curve A in FIG. 4, and its damping is very low, e.g. —1 db. The transmission characteristic of the signal component 150 is represented by the curve B in FIG. 4 and its damping is relatively high, e.g. about —15 db ±5 db. In the antenna connector C1, the branch signal 120 is split-up according to predetermined frequency ranges and supplied to corresponding consuming circuits or appliances, for example TV or radio sets in the apartments. The antenna connectors are designed such that their terminal impedances 16 for the branch signal 120 be as close to the characteristic impedance of the master antenna system as possible. If the two impedances are equal, no signal reflection occurs. However, in practice a mismatch of the two impedances is present and a signal 170 is reelected. The reflection signal 170 is received at the tap terminal 13 and is split-up in transformer T1 into two signal components 180 and 190. The reflected signal component 180 undergoes a damping during its passage through the transformer, as indicated by curve B in FIG. 5, and is transmitted via input terminal 11 as a part of signal 280 delivered in opposite direction to the antenna amplifier. The damping of the other reflected signal component 190 should be a damping as large as possible, it undergoes a damping (e.g. —50 db) during its passage through the transformer, as illustrated by curve C in FIG. 5. At the output terminal 12, the reflected signal component 190 is combined with the antenna signal component 140 to produce an input signal 110 applied to the input terminal of the second transformer T2. It is desirable that the proportion of the reflected signal component 190 in the input signal 110 be as small as possible because the signal 190 is phase shifted relative to the signal 140. The phase difference causes disturbances in the appliances pertaining to subsequent antenna connectors, e.g., ghost images during the TV reception may appear.

The suppression of these disturbances by the transformer of this invention will be explained with reference to the signal 210 reflected from the antenna connector C2. The reflected signal 210 is split-up in the transformer T2 into a reflected signal component 220 transmitted in the direction of the subsequent transformer $T_n$, and into a signal component 230 which is added to a signal component 240 derived from the input signal 110, and is transmitted in opposite direction as a signal 50 toward the preceding transformer T1. The signal component 40 is thus affected by subsequent reflection signals from all remaining antenna connectors.

In the first transformer T1, the reflected signal 250 is split-up or transformed into signal components 260 and 270. The damping of component 270 corresponds to minute damping of the before described signal component 140 while the damping of component 260 corresponds to the relatively large damping of signal component 190. Since the reflected signal component 260 is superposed to the original branch signal 120 and is phase shifted (time delayed) relative to the latter, the phase difference would cause the above described disturbances in the reception of signals at the appliances. Therefore, the strong damping of the signal 260 is desirable.

Signal components 270 and 180 in the transformer T1 are combined into the signal 280 which is transmitted to the antenna amplifier where, under ideal conditions, is reflection free neutralized by its terminal impedance.

Hence, it is essential for the operation of the directional transformer of this invention that signal 140 undergoes minimum damping while signals 190 and 260 are subject to maximum damping. This is achieved by minimizing values of series connected capacitors resulting between the conductive webs, the conductive layer 28 and the ground layer G. The small capacitor values are made possible due to the provision of the additional insulating support 27 for the conductive layer 28 and due to the fact that the layer 28 is not connected to any of the remaining conductive components of the transformer.

What is claimed as new and desired to be protected by Letters Patent is set forth in the appended claims:

1. A directional high-frequency broadband transformer made by a printed circuit technique, comprising an insulating plate and, mounted on said plate, a coil arrangement including a magnetically closed ferrite core, inductive elements in the form of conductive webs inductively coupled with one another via said core, and an input terminal, an output terminal and a tap terminal electrically connected to assigned inductive elements; a ground layer mounted on said plate around said inductive elements; a dielectric plate mounted on said insulating plate and extending over at least a portion of said inductive elements and said ground layer; and a separate conductive layer mounted on said dielectric plate and being capacitively coupled in series with distributed capacitive elements resulting between respective inductive elements and between the inductive elements and said ground layer.

2. A transformer as defined in claim 1, further comprising a balance resistor mounted on said insulating plate and connected by a strip line to said coil arrangement.

3. A transformer as defined in claim 1, wherein a part of said conductive webs form two multiple winding spirals each having an outer end connected to said ground layer.

4. A transformer as defined in claim 3, wherein said conductive webs are spaced apart at different distances from one another and parts of said webs differ in width.

5. An antenna system comprising an antenna, an amplifier connected at its input to the antenna, a remote antenna connector, and a directional high-frequency broadband transformer made by a printed circuit technique, and including an insulating plate and, mounted on said plate, a coil arrangement including a magnetically closed ferrite core, inductive elements in the form of conductive webs inductively coupled with one another via said core, and an input terminal, an output terminal and a tap terminal electrically connected to assigned inductive elements, a ground layer mounted on said plate around said inductive elements, a dielectric plate mounted on said insulating plate and extending over at least a portion of said inductive elements and said ground layer, and a separate conductive layer mounted on said dielectric plate and being capacitively coupled in series with distributed capacitive elements resulting between respective inductive elements and between the inductive elements and said ground layer, and a balance resistor mounted on said insulating plate and connected by a strip line to said coil arrangement, said input terminal being connected to an output of said amplifier and said tap terminal being connected to said remote antenna connector, and said balance resistor having a value differing from a characteristic impedance of the antenna system.

6. An antenna system as defined in claim 5, further comprising at least one additional remote antenna connector and at least one additional directional high-frequency broadband transformer having its output terminal connected to the output terminal of the first mentioned directional high-frequency broadband transformer, and its tap terminal connected to said additional remote antenna connector.

* * * * *